US012641786B2

(12) United States Patent
Ku et al.

(10) Patent No.: US 12,641,786 B2
(45) Date of Patent: May 26, 2026

(54) MEMORY DEVICE AND METHOD FOR CONTROLLING VERIFICATION VOLTAGE OF MEMORY DEVICE

(71) Applicant: eMemory Technology Inc., Hsin-Chu (TW)

(72) Inventors: Wei-Ming Ku, Hsinchu County (TW); Wei-Chiang Ong, Hsinchu County (TW); Chih-Yang Huang, Hsinchu County (TW); Che-Wei Chang, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 147 days.

(21) Appl. No.: 18/882,728

(22) Filed: Sep. 11, 2024

(65) Prior Publication Data

US 2025/0157553 A1    May 15, 2025

Related U.S. Application Data

(60) Provisional application No. 63/598,558, filed on Nov. 14, 2023.

(51) Int. Cl.
| | |
|---|---|
| *H10B 41/60* | (2023.01) |
| *G11C 16/16* | (2006.01) |
| *G11C 16/26* | (2006.01) |
| *G11C 16/30* | (2006.01) |
| *G11C 16/34* | (2006.01) |

(Continued)

(52) U.S. Cl.
CPC ............. *H10B 41/60* (2023.02); *G11C 16/16* (2013.01); *G11C 16/26* (2013.01); *G11C 16/30* (2013.01); *G11C 16/3459* (2013.01); *H03K 19/018521* (2013.01); *H10B 41/35* (2023.02);

*H10D 30/685* (2025.01); *H10D 30/6892* (2025.01); *G11C 5/145* (2013.01)

(58) Field of Classification Search
CPC ...................................................... G11C 5/145
See application file for complete search history.

(56) References Cited

U.S. PATENT DOCUMENTS

| | | | |
|---|---|---|---|
| 5,347,490 | A | 9/1994 | Terada |
| 7,463,532 | B2 | 12/2008 | Tran |

(Continued)

FOREIGN PATENT DOCUMENTS

| | | |
|---|---|---|
| TW | 201214442 A1 | 4/2012 |

*Primary Examiner* — Jason Lappas
(74) *Attorney, Agent, or Firm* — Winston Hsu

(57)    ABSTRACT

A memory device and a method for controlling a verification voltage of a memory device are provided. The method includes: determining a bit count of data bits verified in one verification cycle to be K according to electrical characteristics of a memory sector of the memory device, wherein K is a positive integer; controlling a charge pump circuit of the memory device to start detecting the verification voltage and start pulling up the verification voltage at a beginning time point of a present verification cycle of the memory sector; controlling the charge pump circuit to stop pulling up the verification voltage at a verification time point of the present verification cycle in response to the verification voltage reaching a predetermined level; and after the verification time point of the present verification cycle, using the verification voltage to verify K data bits written into the first memory sector.

22 Claims, 6 Drawing Sheets

(51) Int. Cl.
　　*H03K 19/0185*　　　(2006.01)
　　*H10B 41/35*　　　　(2023.01)
　　*H10D 30/68*　　　　(2025.01)
　　*G11C 5/14*　　　　(2006.01)

(56)　　　　　　References Cited

U.S. PATENT DOCUMENTS

| | | | |
|---|---|---|---|
| 11,250,921 B1 | 2/2022 | Chen | |
| 2007/0291547 A1* | 12/2007 | Ha | .......................... G11C 5/145 |
| | | | 365/185.23 |
| 2012/0155168 A1 | 6/2012 | Kim | |

* cited by examiner

MEMORY DEVICE AND METHOD FOR CONTROLLING VERIFICATION VOLTAGE OF MEMORY DEVICE

CROSS REFERENCE TO RELATED APPLICATIONS

This application claims the benefit of U.S. Provisional Application No. 63/598,558, filed on Nov. 14, 2023. The content of the application is incorporated herein by reference.

BACKGROUND OF THE INVENTION

1. Field of the Invention

The present invention is related to memory verification, and more particularly, to a memory device and a method for controlling a verification voltage of a memory device.

2. Description of the Prior Art

In a memory device, a voltage range of a specification voltage and a voltage range of a verification voltage can be different. Thus, a voltage control mechanism is typically required to make a driving voltage of the memory device be switched in response to various conditions. Under a low voltage operation, a level of the specification voltage may be lower than the verification voltage, and the memory device therefore pull up the driving voltage from the level of the specification voltage to the level of the verification voltage when performing verification of an erase operation or a program operation. Continuous fixing or controlling the driving voltage at the level of the verification voltage may introduce unexpected peak currents, and thereby generate power noise and ground noise, making precision of the verification degrade.

Thus, there is a need for a novel method and associated architecture, which can improve the precision of the verification for the erase operation or the program operation.

SUMMARY OF THE INVENTION

An objective of the present invention provides a memory device and a method for controlling a verification voltage of a memory device, in order to solve the problem of the related art without introducing any side effect or in a way that is less likely to introduce side effects.

At least one embodiment of the present invention provides a method for controlling a verification voltage of a memory device. The method comprises: determining a bit count of data bits verified in one verification cycle to be K according to electrical characteristics of a first memory sector of the memory device, wherein K is a positive integer; controlling a charge pump circuit of the memory device to start detecting the verification voltage and start pulling up the verification voltage at a beginning time point of a present verification cycle of the first memory sector; controlling the charge pump circuit to stop pulling up the verification voltage at a verification time point of the present verification cycle in response to the verification voltage reaching a predetermined level; and after the verification time point of the present verification cycle, using the verification voltage to verify K data bits written into the first memory sector.

At least one embodiment of the present invention provides a memory device. The memory device comprises a first memory sector, a controller and a charge pump circuit, wherein the charge pump circuit is coupled to the controller. The controller is configured to determine a bit count of data bits verified in one verification cycle to be K according to electrical characteristics of the first memory sector, wherein K is a positive integer. In addition, the charge pump circuit is configured to transmit a verification voltage to the first memory sector. More particularly, the controller is configured to control the charge pump circuit to start detecting the verification voltage and start pulling up the verification voltage at a beginning time point of a present verification cycle, and is further configured to control the charge pump circuit to stop pulling up the verification voltage at a verification time point of the present verification cycle in response to the verification voltage reaching a predetermined level. More particularly, K data bits written into the memory device are verified based on the verification voltage after the verification time point of the present verification cycle.

The method and the memory device estimates the bit count of data bits that can be verified under a condition where the verification voltage is hold at an acceptable range without further pumping operations. Thus, during one verification cycle, a pumping operation of the verification voltage is executed for a fixed number of times (e.g. only once) in one verification cycle, in order to make the power noise or the ground noise generated by the pumping operation less likely to affect verification precision. In addition, the embodiments of the present invention will not greatly increase additional costs. Thus, the present invention can solve the problem of the related art without introducing any side effect or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
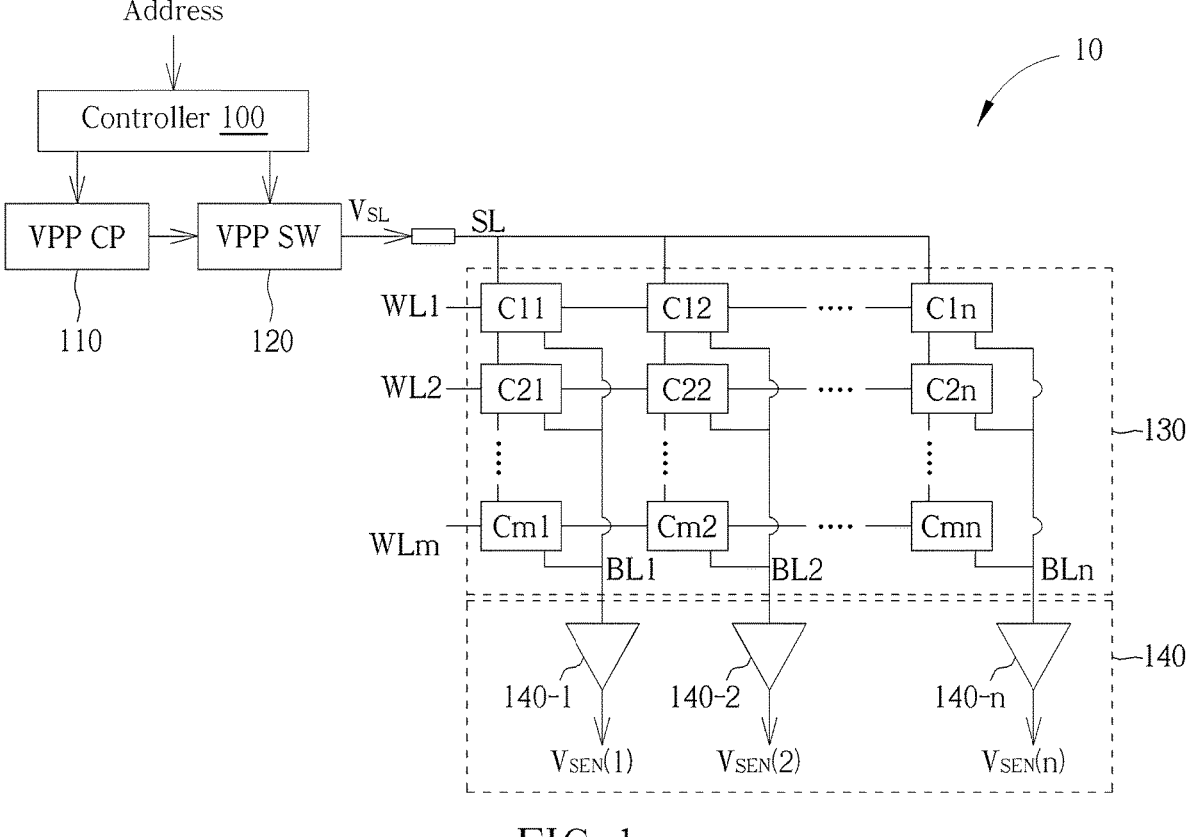
FIG. 1 is a diagram illustrating a memory device according to an embodiment of the present invention.

FIG. 1 is a diagram illustrating a memory device 10 according to an embodiment of the present invention. As shown in FIG. 1, the memory device 10 comprises a controller 100, a charge pump circuit 110 which can pump a specification voltage to a verification voltage (labeled "VPP CP" for better comprehension), a power switch 120 (labeled "VPP SW" for better comprehension), a memory sector such as a cell array 130 (which has parasitic capacitors therein) and a sense end circuit 140. Examples of implementation of the controller 100 may include, but are not limited to: a field programmable gate array (FPGA), an application specific integrated circuit (ASIC), a single-chip device, a multi-chip device, any suitable logical circuit, etc. The charge pump circuit 110 is coupled to the controller 100, the power switch 120 is coupled to the controller 100 and the charge pump circuit 110, and the cell array 130 is coupled to the power switch 120. The cell array 130 is coupled to the sense end circuit 140, and comprises m×n memory cells C11~Cmn, where m and n are positive integers. The sense end circuit 140 is configured to verify the memory cells C11~Cmn, where the sense end circuit 140 may comprise sense amplifiers 140-1, 140-2, . . . and 140-n. In particular, a source line SL is coupled to one or more of the memory cells C11~Cmn. A word line WL1 is coupled to the memory cells C11, C12, . . . and C1n, a word line WL2 is coupled to the memory cells C21, C22, . . . and C2n, and deduced by analogy, a word line WLm is coupled to the memory cells Cm1, Cm2, . . . and Cmn. A bit line BL1 is coupled to the memory cells C11, C21, . . . and Cm1, a bit line BL2 is coupled to the memory cells C12, C22, . . . and Cm2, and deduced by analog, a bit line B1n is coupled to the memory cells C1n, C2n, . . . and Cmn. In this embodiment, the sense amplifiers 140-1, 140-2, . . . and 140-n are respectively coupled to the bit lines BL1, BL2, . . . and BLn, where the sense amplifier 140-1 is configured to verify the memory cells C11, C21, . . . and Cm1 to output a sensed output voltage $V_{SEN}(1)$, the sense amplifier 140-2 is configured to verify the memory cells C12, C22, . . . and Cm2 to output a sensed output voltage $V_{SEN}(2)$, and deduced by analogy, the sense amplifier 140-n is configured to verify the memory cells C1n, C2n, . . . and Cmn to output a sensed output voltage $V_{SEN}(n)$. In some embodiment, a number of sense amplifiers within the sense end circuit 140 may be less than n, where one or more multiplexers may be coupled between the cell array 130 and the sense end circuit 140. For example, a multiplexer may be coupled to multiple bit lines of the bit lines BL1~BLn, and this multiplexer may select one of these bit lines to be coupled to a sense amplifier within the sense end circuit 140 by turns, in order to make this sense amplifier verify memory cells coupled to these bit lines by turns. With these multiplexers, the number of sense amplifiers within the sense end circuit 140 can be reduced.

In this embodiment, the controller 100 is configured to determine a bit count of data bits verified in one verification cycle to be K according to an address for accessing the memory sector (e.g. the cell array 130), and more particularly, is configured to determining the bit count of data bits verified in one verification cycle to be K according to electrical characteristics of the memory sector (e.g. the cell array 130) of the memory device 10, wherein K is a positive integer and smaller than or equal to n. For example, verification of the cell array 130 may be performed on K memory cells C11~C1K in one verification cycle. During this verification cycle, among the n sense amplifiers, K sense amplifiers corresponding to the K memory cells C11~C1K are enabled. The controller 100 may control the charge pump circuit 110 to start detecting a verification voltage (e.g. $V_{SL}$) and start pulling up the verification voltage $V_{SL}$ at a beginning time point of a present verification cycle of the cell array 130, and controls the charge pump circuit 110 to stop detecting the verification voltage $V_{SL}$ and stop pulling up the verification voltage $V_{SL}$ at a verification time point of the present verification cycle in response to the verification voltage $V_{SL}$ reaching a predetermined level. More particularly, at the verification time point, the controller 100 may control the charge pump circuit 110 to stop pumping until an end time point of the present verification cycle. The verification voltage $V_{SL}$ may marginally increase after the verification time point due to latency in signal transmission between the controller 100 and the charge pump circuit 110. K data bits written into the memory device 10 (e.g. K data bits written into the memory cells C11, C12, . . . and C1K) are verified based on the verification voltage $V_{SL}$ after the verification time point of the present verification cycle. The term "write" may represent "program" or "erase" performed by the memory device 10.

In this embodiment, the controller 100 may control the power switch 120 to transmit the verification voltage $V_{SL}$ to a memory sector (e.g. the cell array 130 shown in FIG. 1) of the memory device 10 from the charge pump circuit 110, in order to verify the K data bits written into the memory sector. More particularly, the power switch 120 may transmit the verification voltage $V_{SL}$ to a source line (e.g. the source line SL shown in FIG. 1) of the memory sector, in order to verify the K data bits written into the memory sector. In some embodiments, the source line SL is coupled to and shared by all memory cells C11~Cmn of the memory sector.

Figure 2:
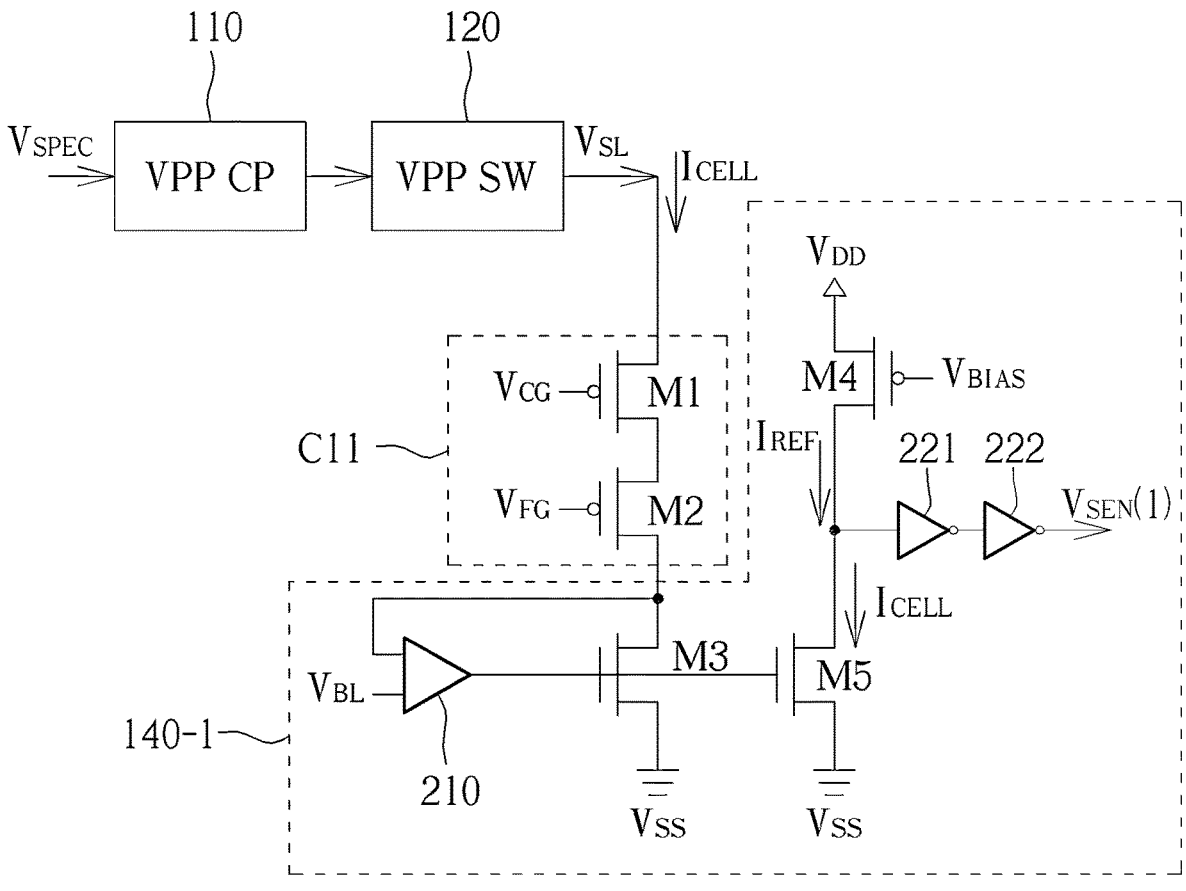
FIG. 2 is a diagram illustrating a sense amplification scheme of verification according to an embodiment of the present invention.

FIG. 2 is a diagram illustrating a sense amplification scheme of verification according to an embodiment of the present invention. It should be noted that FIG. 2 merely shows one memory cell such as the memory cell C11 shown in FIG. 1 (which comprises transistors M1 and M2) and one sense amplifier such as the sense amplifier 140-1 shown in FIG. 1 (which comprises transistors M3, M4 and M5, an amplifier 210 and inverters 221 and 222) for brevity, where a number of memory cells and a number of sense amplifiers are not meant to be limitations of the present invention. Assume that the verification voltage $V_{SL}$ transmitted to the source line connected to the memory cell (e.g. the transistor M1 therein) is at 2.4~3.6 volt (V), and a voltage on a bit line connected to the memory cell (e.g. the transistor M2 therein) is fixed at 0.4 V with the aid of a feedback loop formed by the amplifier 210 by setting $V_{BL}=0.4$ V. Thus, a cell current $I_{CELL}$ may be generated according to a control gate voltage $V_{cG}$ and a floating gate voltage $V_{FG}$. Magnitude of the cell current $I_{CELL}$ may correspond to a data bit stored in this memory cell, and the cell current $I_{CELL}$ flowing through the transistor M3 (which is coupled to a reference voltage VSS) may be copied to the transistor M5. By comparing the cell current $I_{CELL}$ flowing through the transistor M5 (which is coupled to the reference voltage VSS) with a reference current $I_{REF}$ generated by the transistor M4 (which is coupled to a reference voltage VDD) with a gate bias voltage VBIAS, a sensed output voltage $V_{SEN}(1)$ may be outputted from the inverter 222. Assume that the reference current $I_{REF}$ may be 5 micro ampere (μA). When the memory device 10 conducts an erase operation to set the memory cell C11 to an erase state, the cell current $I_{CELL}$ is expected to be 1 μA, and the memory device 10 may determine whether the erase operation is successful by checking whether the sensed output voltage $V_{SEN}(1)$ is high (e.g. whether the cell current $I_{CELL}$ is less than the reference current $I_{REF}$). When the memory device 10 conducts a program operation to set the memory cell C11 to an program state, the cell current $I_{CELL}$ is expected to be 10 μA, and the memory device 10 may determine whether the program operation is successful by checking whether the sensed output voltage $V_{SEN}(1)$ is low (e.g. whether the cell current $I_{CELL}$ is greater than the reference current $I_{REF}$). Accordingly, the sense amplifier 140-1 is configured to verify the memory cell C11.

In some embodiment, verification of a whole memory sector (e.g. all memory cells C11~Cmn within the cell array

130 shown in FIG. 1) of the memory device 10 may be completed in multiple verification cycles (e.g. when the number of the memory cells C11~Cmn within the cell array 130 is greater than K). During each of the multiple verification cycles, the verification voltage $V_{SL}$ is pulled to the predetermined level only once. In other words, when the verification voltage $V_{SL}$ is pulled to the predetermined level, the controller 100 may control the charge pump circuit 110 to stop pulling up the verification voltage $V_{SL}$ until the end time point of the present verification cycle. In some embodiments, the charge pump circuit 130 may pull the verification voltage $V_{SL}$ to the predetermined level for a fixed number of times in each verification cycle of the memory sector (e.g. the cell array 130), where the charge pump circuit 130 may pull the verification voltage $V_{SL}$ to the predetermined level once every fixed time period. For example, the charge pump circuit 130 may pull the verification voltage $V_{SL}$ to the predetermined level once every half cycle time of one verification cycle, which means the charge pump circuit 130 may pull the verification voltage $V_{SL}$ to the predetermined level twice in one verification cycle, but the present invention is not limited thereto.

Figure 3:
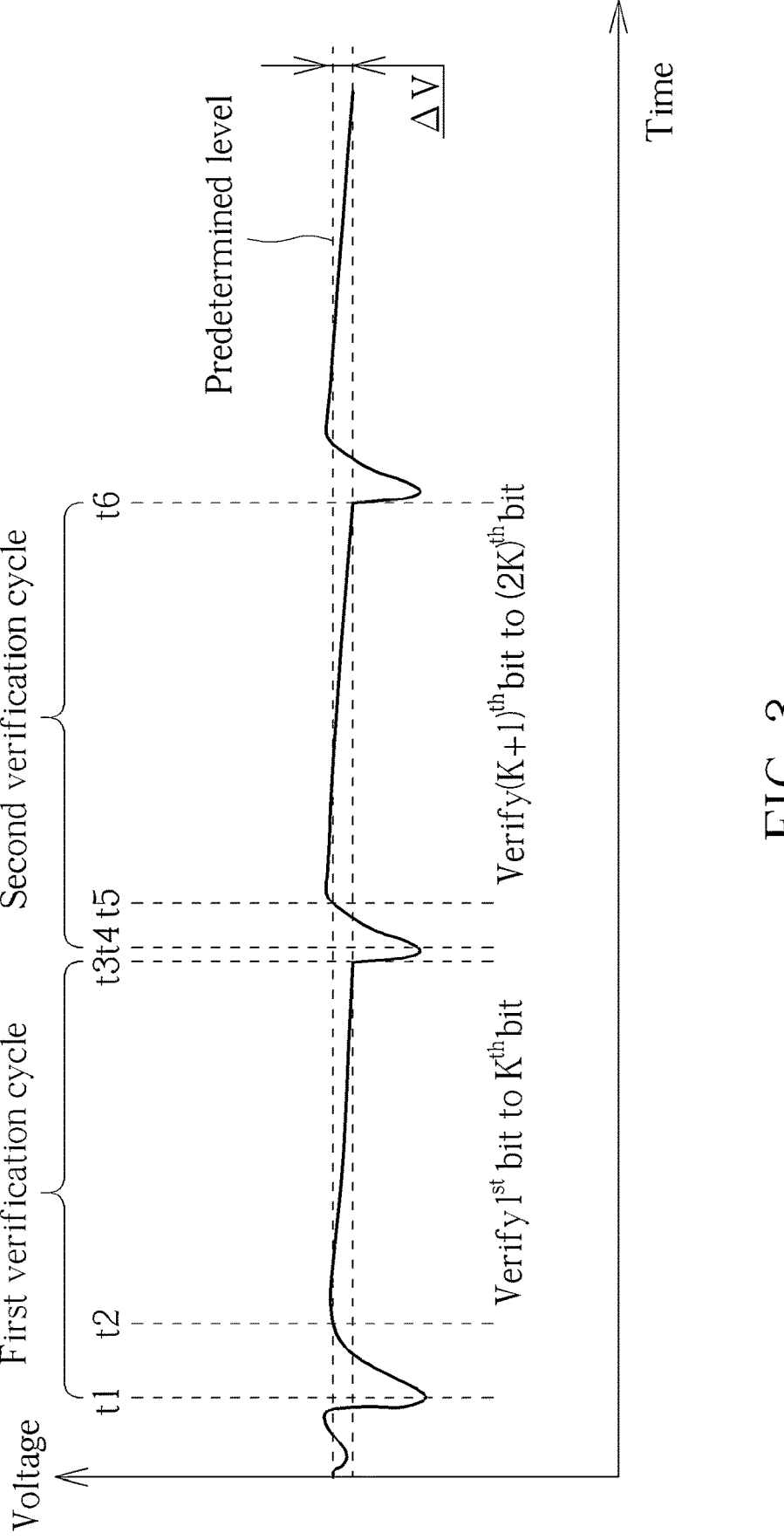
FIG. 3 is a diagram illustrating a waveform of a verification voltage according to an embodiment of the present invention.

FIG. 3 is a diagram illustrating a waveform of the verification voltage $V_{SL}$ according to an embodiment of the present invention. As shown in FIG. 3, the verification voltage $V_{SL}$ may start to be pulled up at a time point t1 (which may be an example of the beginning time point mentioned above) of a first verification cycle, and the verification voltage $V_{SL}$ may reach the predetermined level at a time point t2 (which may be an example of the verification time point mentioned above) of the first verification cycle. From the time point t2 to an end time point of the first verification cycle such as a time point t3, the charge pump circuit 110 stops detecting and controlling (e.g. pulling up) the verification voltage $V_{SL}$, and the sense end circuit 140 verifies a first bit to a Kth bit of the cell array 130 (e.g. the memory cells C11~C1K). The verification voltage $V_{SL}$ may keep decreasing from around the time point t2, when the charge pump stops pulling up the verification voltage, until the time point t3 of the first verification cycle. Even though the level of the verification voltage $V_{SL}$ slowly gets lower when verifying the first bit to the Kth bit of the cell array 130, but the level of the verification voltage $V_{SL}$ can be held in an acceptable range before the end time point of the first verification cycle such as the time point t3 because of the parasitic capacitors within the cell array 130. In this embodiment, the charge pump circuit 110 may be reset during a period between the time point t3 and a time point t4, and a next verification cycle may start at the time point t4. Similarly, the verification voltage $V_{SL}$ starts to be pulled up at the time point t4 (e.g. the beginning time point) of a second verification cycle and reaches the predetermined level at a time point t5 (e.g. the verification time point) of the second verification cycle, where the process of verifying a $(K+1)^{th}$ bit to a $(2K)^{th}$ bit during a period from the time point t5 to the time point t6 (e.g. an end time point of the second verification cycle) is similar to that from the time point t2 to the time point t3. The rest may be deduced by analogy. As shown in FIG. 3, during each of the first verification cycle, the second verification cycle, etc., the verification voltage $V_{SL}$ is pulled to the predetermined level only once, as the controller 100 controls the charge pump circuit 110 to stop detecting and controlling (e.g. pulling up) the verification voltage $V_{SL}$, at the time point that the verification voltage $V_{SL}$ reaches the predetermined level, until the end time point of the present verification cycle. This minimizes power noise and/or ground noise introduced by ripple of the verification voltage $V_{SL}$. The verification voltage $V_{SL}$ may marginally increase after the verification time point due to latency in signal transmission between the controller 100 and the charge pump circuit 110.

It should be noted that the memory device 10 may comprise multiple memory sectors, where the cell array 130 may be one of the memory sector, and implementations of the rest may be deduced by analogy. More particularly, the multiple memory sectors of the memory device 10 may comprise different numbers of memory cells, and the multiple memory sectors of the memory device 10 may respectively correspond to multiple values of the bit count of data bits verified in one verification cycle, where the address shown in FIG. 1 may indicate which one of the multiple memory sectors is to be verified. For a certain memory sector (e.g. the cell array 130) of the multiple memory sectors, a corresponding value of the bit count of data bits of this memory sector verified in one verification cycle may be determined according to the electrical characteristics such as a memory density of this memory sector. The memory density may represent a number of memory cells within this memory sector. In some embodiments, a parasitic capacitor may be formed between a memory cell and the source line SL, and therefore the parasitic capacitance of the source line SL is positively correlated with the memory density. In more specific terms, the value of the bit count of data bits verified in one verification cycle may be determined according to the following electrical characteristics: (1) the cell current $I_{CELL}$ for a single memory cell of this memory sector; (2) a sensing time $T_{SEN}$ for verifying the K data bits, such as the period from the verification time point to the end time point of the verification cycle (e.g. a period from the time point t2 to the time point t3); (3) a maximum acceptable voltage drop $\Delta V$ of the verification voltage $V_{SL}$ in the sensing time $T_{SEN}$ (or can be understood as the minimum acceptable level of the verification voltage $V_{SL}$ in the sensing time $T_{SEN}$); and (4) the parasitic capacitance $C_{TOTAL}$ of the source line SL (which may be regarded as a battery) of this memory sector. In some embodiments, the maximum value of the bit count of data bits verified in one verification cycle is determined by $N_{IOS}=(\Delta V \times C_{TOTAL})/(I_{CELL} \lambda T_{SEN})$, where "$N_{Ios}$" represents the maximum value of the bit count of data bits verified in one verification cycle; "$\Delta V$" represents the maximum acceptable voltage drop of the verification voltage $V_{SL}$; "$C_{TOTAL}$" represents the parasitic capacitance of the source line SL; and "$T_{SEN}$" represents the sensing time. As for a first memory sector (e.g. the cell array 130) and a second memory sector (e.g. another cell array within the memory device 10) among the multiple memory sectors, when a number of memory cells within the first memory sector is greater than a number of memory cells within the second memory sector (which means the source line SL of the first memory sector has greater parasitic capacitance than that of the source line SL of the second memory sector), a value of the bit count of data bits of the first memory sector verified in one verification cycle can be greater than a value of the bit count of data bits of the second memory sector verified in one verification cycle.

In practice, the bit count of data bits verified in one verification cycle may be set to an integer not greater than a calculation result of $(\Delta V \times C_{TOTAL})/(I_{CELL} \times T_{SEN})$. Thus, in each verification cycle of a memory sector, a practical voltage drop $\Delta V'$ of the verification voltage $V_{SL}$ is not greater than the maximum acceptable voltage drop $\Delta V$. Assume that the cell current $I_{CELL}$ of a single memory cell is 20 μA and a sensing time is 200 nanoseconds (ns), where a maximum acceptable voltage drop of the verification voltage $V_{SL}$ is 0.1 V. When a total parasitic capacitance of the cell array 130 is 400 pF, the bit count of data bits verified in one verification cycle may be set as 8, as 8< (0.1V×400 pF)/(20μA×200 ns). When the total parasitic capacitance of the cell array 130 is 200 pF, the bit count of data bits verified in one verification cycle may be set as 4, as 4< (0.1V×200 pF)/(20μA×200 ns). When the total parasitic capacitance of the cell array 130 is 100 pF, the bit count of data bits verified in one verification cycle may be set as 2, as 2< (0.1V×100 pF)/(20μA×200 ns). When the total parasitic capacitance of the cell array 130 is 50 pF, the bit count of data bits verified in one verification cycle may be set as 1, as 1< (0.1V×50 pF)/(20μA×200 ns).

In addition, settings of the sense amplifiers 140-1~140-$n$ associated with the verification mentioned above may be determined according to the value of the bit count of data bits verified in one verification cycle. In some embodiments, the number of sense amplifiers enabled in one verification cycle is identical to the value of the bit count of data bits verified in one verification cycle. More particularly, K sense amplifiers of the memory device 10 may be enabled in the present verification cycle to verify the K data bits, and the other sense amplifiers of the memory device 10 may be disabled in the present verification cycle. For example, when verifying the first bit to the Kth bit of the cell array 130, the sense amplifiers 140-1~140-K are enabled to output the sensed output voltages $V_{SEN}(1)$~$V_{SEN}(K)$ corresponding to the first bit to the Kth bit of the cell array 130, while the sense amplifiers 140-(K+1)~140-$n$ are disabled (i.e., not outputting the sensed output voltage $V_{SEN}(K+1)$~$V_{SEN}(n)$). As another example, when verifying the $(K+1)^{th}$ bit to the $(2K)^{th}$ bit of the cell array 130, the sense amplifiers 140-(K+1)~140-2K are enabled to output the sensed output voltages $V_{SEN}(K+1)$~$V_{SEN}(2K)$. Therefore, when the number of memory cells within the first memory sector is greater than the number of memory cells within the second memory sector (which means the first memory sector has a greater charge storage ability than the second memory sector), a number of enabled sense amplifiers of the memory device 10 for verifying the first memory sector in one verification cycle can be greater than a number of enabled sense amplifiers of the memory device 10 for verifying the second memory sector in one verification cycle.

Figure 4:
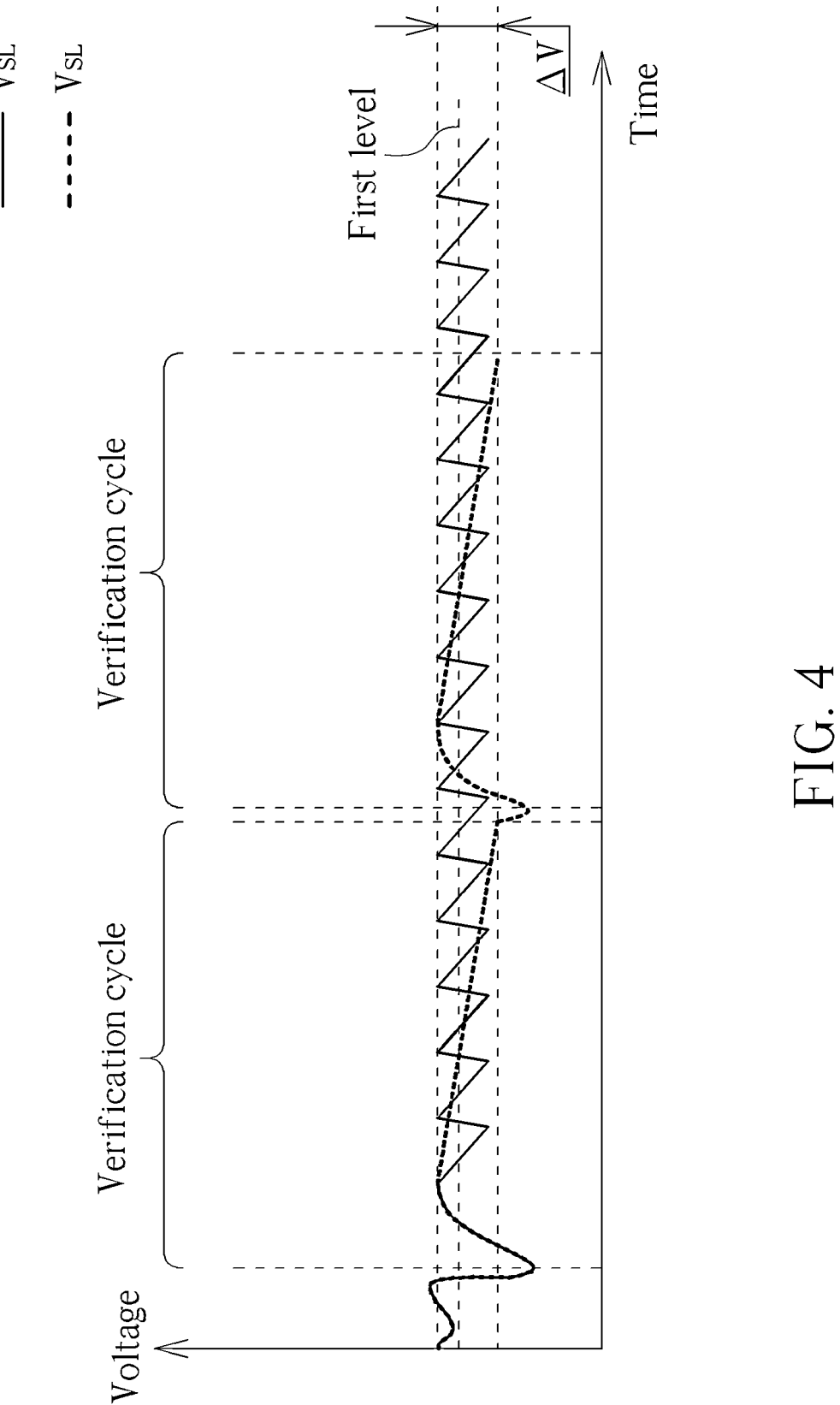
FIG. 4 is a diagram illustrating a waveform of a verification voltage based on another control mechanism.

FIG. 4 is a diagram illustrating a waveform of a verification voltage $V_{SL}'$ based on another control mechanism, where the verification voltage $V_{SL}'$ is kept being detected and pumped during the verification cycle. In particular, when the verification voltage $V_{SL}'$ is higher than a first level, the charge pump circuit 110 may stop pumping, and the verification voltage $V_{SL}'$ may drop. When the verification voltage $V_{SL}'$ drops below the first level, the verification voltage $V_{SL}'$ may be pumped. Thus, repeatedly pumping verification voltage $V_{SL}'$ may be required in one verification cycle under this control mechanism, and therefore peak current induced noises may be introduced, which impact an overall performance of a memory device. For better comprehension of the advantages of the present invention, the waveform of the verification voltage $V_{SL}$ (which is obtained by the embodiment of FIG. 3) is also illustrated in FIG. 4, where the first level may be equivalent to the predetermine level mentioned above. In comparison with the control mechanism applied to the verification voltage $V_{SL}'$, the proposed control mechanism shown in FIG. 3 pumps the verification voltage $V_{SL}$ only once in each verification cycle, which prevents the verification voltage $V_{SL}$ from introducing unwanted ripples, and the peak current induced noises can be greatly reduced.

Figure 5:
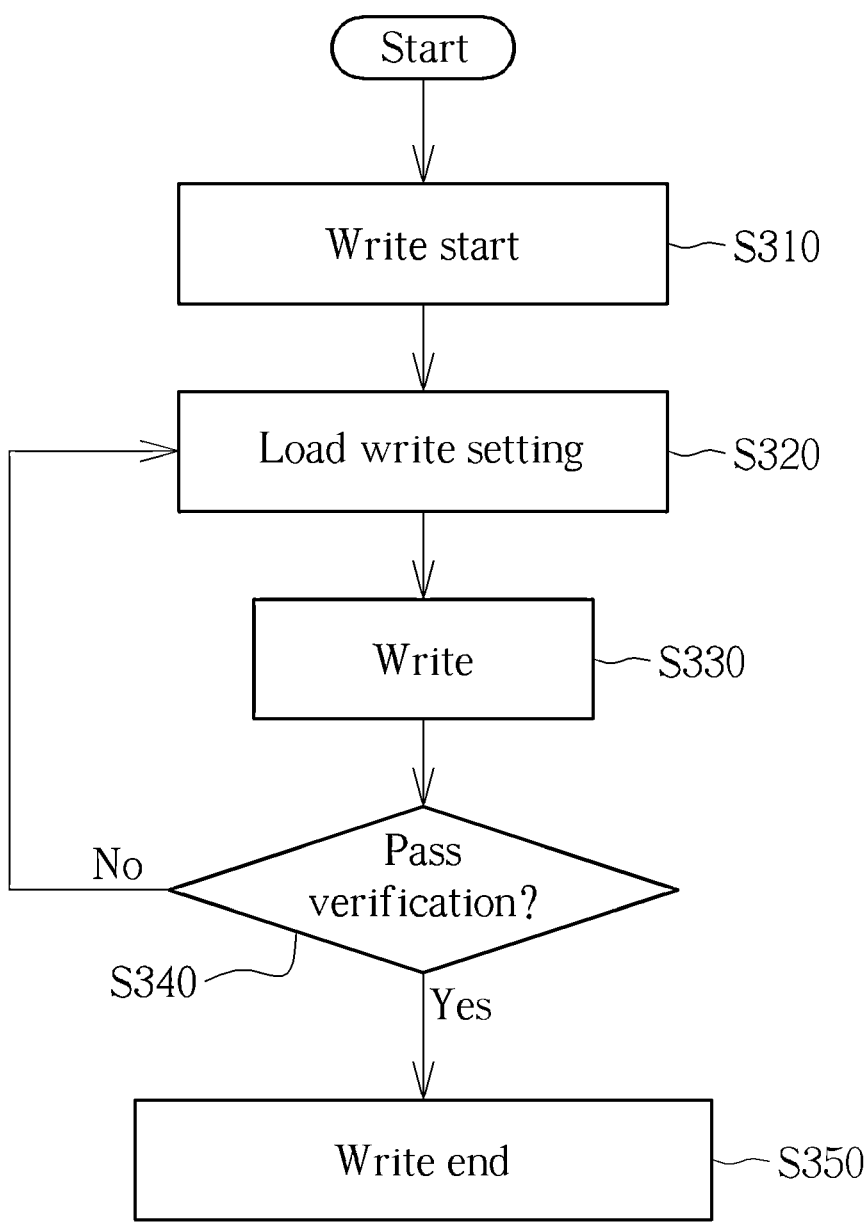
FIG. 5 is a diagram illustrating a working flow of a write operation according to an embodiment of the present invention.

FIG. 5 is a diagram illustrating a working flow of a write operation (i.e. an erase/program operation) according to an embodiment of the present invention, where the working flow may be executed by the memory device 10 shown in FIG. 1. It should be note that the working flow shown in FIG. 5 is for illustrative purposes only, and is not meant to be a limitation of the present invention. For example, one or more steps may be added, deleted or modified in the working flow shown in FIG. 5. In addition, if a same result can be obtained, these steps do not have to be executed in the exact order shown in FIG. 5.

In Step S310, the memory device 10 may start a write procedure.

In Step S320, the memory device 10 may load settings of the write procedure.

In Step S330, the memory device 10 may execute a write operation.

In Step S340, the memory device 10 may perform verification of the write operation and determined whether the verification is passed. If the determination result shows "Yes", the working flow proceeds with Step S350. If the determination result shows "No", the working flow proceeds with Step S320.

In Step S350, the write procedure ends.

Figure 6:
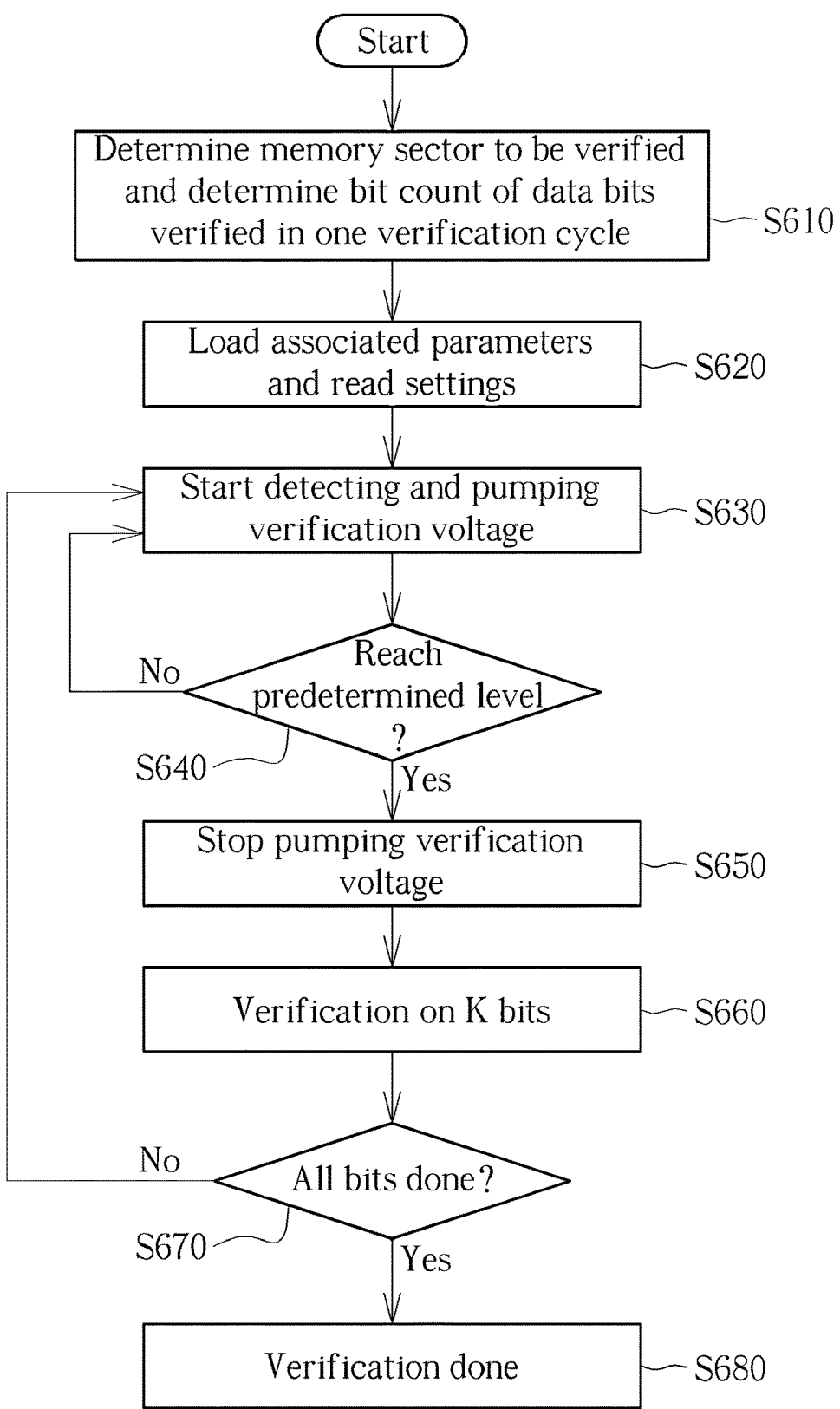
FIG. 6 is a diagram illustrating a working flow of a method for controlling a verification voltage of a memory device according to an embodiment of the present invention.

FIG. 6 is a diagram illustrating a working flow of a method for controlling a verification voltage of a memory device according to an embodiment of the present invention, where the method may be applied to Step S340 shown in FIG. 5. It should be note that the working flow shown in FIG. 6 is for illustrative purposes only, and is not meant to be a limitation of the present invention. For example, one or more steps may be added, deleted or modified in the working flow shown in FIG. 6. In addition, if a same result can be obtained, these steps do not have to be executed in the exact order shown in FIG. 6.

In Step S610, the memory device 10 (e.g. the controller 100) may determine a memory sector (e.g. the cell array 130) to be verified according to an address for accessing the memory sector, and more particularly, may determine a bit count of data bits verified in one verification cycle to be K according to electrical characteristics of the memory sector of the memory device 10. For example, the memory device 10 (e.g. the controller 100) may check the electrical characteristics of the memory sector to determine associated parameters and read settings (e.g. the number of enabled sense amplifiers in one verification cycle). The electrical characteristics include: (1) the cell current $I_{CELL}$ for a single memory cell of this memory sector; (2) the sensing time $T_{SEN}$ for verifying the K data bits in the memory sector; (3) the maximum acceptable voltage drop $\Delta V$ of the verification voltage $V_{SL}$ in the sensing time $T_{SEN}$; and (4) the parasitic capacitance $C_{TOTAL}$ of the source line SL of the memory sector.

In Step S620, the memory device 10 (e.g. the controller 100) may load the associated parameters and read settings determined in Step S610.

In Step S630, the memory device 10 (e.g. the controller 100) may control the charge pump circuit 110 to start detecting the verification voltage $V_{SL}$ and start pulling up (e.g. pumping) the verification voltage $V_{SL}$ at a beginning time point of a present verification cycle of the memory sector.

In Step S640, the memory device 10 may determine whether the verification voltage $V_{SL}$ reaches the predetermined level. If the determination result shows "Yes", the working flow proceeds with Step S650. If the determination result shows "No", the working flow proceeds with Step S630.

In Step S650, the memory device 10 (e.g. the controller 100) may control the charge pump circuit 110 to stop pulling up (e.g. pumping) the verification voltage $V_{SL}$ (more particularly, stop detecting and stop pumping the verification voltage VL) at a verification time point of the present verification cycle in response to the verification voltage $V_{SL}$ reaching the predetermined level. The verification voltage $V_{SL}$ may keep decreasing from Step S650 (i.e. when the charge pump stops pulling up the verification voltage) until the end time point of the present verification cycle (e.g. step S670 or S680).

In Step S660, after the verification time point of the present verification cycle, the memory device 10 may use the verification voltage $V_{sL}$ to verify K data bits written into the memory sector (i.e. performing verification on K bits of the cell array 130).

In Step S670, the memory device 10 may determine whether all bits within the cell array 130 have been verified (e.g. determining whether the K bits verified in Step S660 includes the last bit of the cell array 130, such as the bit corresponding to the memory cell Cmn). If the determination result shows "Yes", the working flow proceeds with Step S680. If the determination result shows "No", the working flow proceeds with Step S630 in order to verify subsequent K bits (i.e. proceeds to the next verification cycle).

In Step S680, the memory device 10 finishes the verification of the write operation.

To summarize, the present invention utilizes parasitic capacitors of the cell array 130 to be a battery, instead of continuously and iteratively pumping the verification voltage $V_{SL}$, which enable further low pass filter(s) or regulator(s) to be omitted to reduce circuit area. As the charge pump circuit 130 stop working when the verification voltage $V_{sL}$ reaches the predetermined level, peak currents will not be generated afterwards. Thus, circuit errors caused by power noise and ground noise can be minimized, and precision of the verification can be greatly improved. In addition, different memory densities respectively result in different parasitic capacitance. Thus, optimized values of the bit count of data bits verified in one verification cycle may be respectively determined with respect to different memory sectors, and associated settings such as sense amplifier numbers may be accordingly determined. It should be noted that the embodiments of the present invention will not greatly increase additional costs. Thus, the present invention can solve the problem of the related art without introducing any side effect or in a way that is less likely to introduce side effects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for controlling a verification voltage of a memory device, comprising:
   determining a bit count of data bits verified in one verification cycle to be K according to electrical characteristics of a first memory sector of the memory device, wherein K is a positive integer;
   controlling a charge pump circuit of the memory device to start detecting the verification voltage and start pulling up the verification voltage at a beginning time point of a present verification cycle of the first memory sector;
   controlling the charge pump circuit to stop pulling up the verification voltage at a verification time point of the present verification cycle in response to the verification voltage reaching a predetermined level; and
   after the verification time point of the present verification cycle, using the verification voltage to verify K data bits written into the first memory sector.

2. The method of claim 1, wherein in each verification cycle of the first memory sector, the charge pump circuit pulls the verification voltage to the predetermined level for a fixed number of times.

3. The method of claim 1, wherein multiple memory sectors of the memory device comprise different numbers of memory cells, and the multiple memory sectors respectively correspond to multiple values of the bit count of data bits verified in one verification cycle.

4. The method of claim 3, wherein a number of memory cells within the first memory sector among the multiple memory sectors is greater than a number of memory cells within a second memory sector among the multiple memory sectors, and a value of the bit count of data bits of the first memory sector verified in one verification cycle is greater than a value of the bit count of data bits of the second memory sector verified in one verification cycle.

5. The method of claim 4, wherein a number of enabled sense amplifiers of the memory device for verifying the first memory sector in one verification cycle is greater than a number of enabled sense amplifiers of the memory device for verifying the second memory sector in one verification cycle.

6. The method of claim 1, wherein K sense amplifiers of the memory device are enabled in the present verification cycle to verify the K data bits, and the other sense amplifiers of the memory device are disabled in the present verification cycle.

7. The method of claim 1, wherein the electrical characteristics of the first memory sector comprise a number of memory cells of the first memory sector.

8. The method of claim 1, wherein the electrical characteristics of the first memory sector comprise:
   a cell current of a memory cell of the first memory sector;
   a sensing time for verifying the K data bits;
   a maximum acceptable voltage drop of the verification voltage in the sensing time; and
   parasitic capacitance of a source line of the first memory sector.

9. The method of claim 8, wherein in each verification cycle of the first memory sector, a practical voltage drop of the verification voltage is not greater than the maximum acceptable voltage drop.

10. The method of claim 1, wherein verification of the whole first memory sector of the memory device is completed in multiple verification cycles, and during each of the multiple verification cycles, the verification voltage is pulled to the predetermined level only once.

11. The method of claim 1, wherein when the charge pump stops pulling up the verification voltage, the verification voltage keeps decreasing until an end time point of the present verification cycle.

12. A memory device, comprising:
   a first memory sector;
   a controller, configured to determine a bit count of data bits verified in one verification cycle to be K according to electrical characteristics of the first memory sector, wherein K is a positive integer; and a charge pump circuit, coupled to the controller, and configured to transmit a verification voltage to the first memory sector;

wherein:

the controller is configured to control the charge pump circuit to start detecting the verification voltage and start pulling up the verification voltage at a beginning time point of a present verification cycle;

the controller is further configured to control the charge pump circuit to stop pulling up the verification voltage at a verification time point of the present verification cycle in response to the verification voltage reaching a predetermined level; and K data bits written into the memory device are verified based on the verification voltage after the verification time point of the present verification cycle.

13. The memory device of claim 12, wherein in each verification cycle of the first memory sector, the charge pump circuit pulls the verification voltage to the predetermined level for a fixed number of times.

14. The memory device of claim 12, wherein multiple memory sectors of the memory device comprise different numbers of memory cells, and the multiple memory sectors respectively correspond to multiple values of the bit count of data bits verified in one verification cycle.

15. The memory device of claim 14, wherein a number of memory cells within the first memory sector among the multiple memory sectors is greater than a number of memory cells within a second memory sector among the multiple memory sectors, and a value of the bit count of data bits of the first memory sector verified in one verification cycle is greater than a value of the bit count of data bits of the second memory sector verified in one verification cycle.

16. The memory device of claim 15, wherein a number of enabled sense amplifiers of the memory device for verifying the first memory sector in one verification cycle is greater than a number of enabled sense amplifiers of the memory device for verifying the second memory sector in one verification cycle.

17. The memory device of claim 12, wherein K sense amplifiers of the memory device are enabled in the present verification cycle to verify the K data bits, and the other sense amplifiers of the memory device are disabled in the present verification cycle.

18. The memory device of claim 12, wherein the electrical characteristics of the first memory sector comprise a number of memory cells of the first memory sector.

19. The memory device of claim 12, wherein the electrical characteristics of the first memory sector comprise:

a cell current of a memory cell of the first memory sector;

a sensing time for verifying the K data bits;

a maximum acceptable voltage drop of the verification voltage in the sensing time; and parasitic capacitance of a source line of the first memory sector.

20. The memory device of claim 12, wherein in each verification cycle of the first memory sector, a practical voltage drop of the verification voltage is not greater than the maximum acceptable voltage drop.

21. The memory device of claim 12, wherein verification of the whole first memory sector of the memory device is completed in multiple verification cycles; and during each of the multiple verification cycles, the verification voltage is pulled to the predetermined level only once.

22. The memory device of claim 12, wherein when the charge pump stops pulling up the verification voltage, the verification voltage keeps decreasing until an end time point of the present verification cycle.

* * * * *